United States Patent [19]
Harada et al.

[11] Patent Number: 6,040,627
[45] Date of Patent: Mar. 21, 2000

[54] SEMICONDUCTOR DEVICE AND METHOD OF MANUFACTURING SEMICONDUCTOR DEVICE

[75] Inventors: Akihiko Harada; Keiichi Higashitani, both of Tokyo, Japan

[73] Assignee: Mitsubishi Denki Kabushiki Kaisha, Tokyo, Japan

[21] Appl. No.: 09/059,702

[22] Filed: Apr. 14, 1998

[51] Int. Cl.[7] .......................... H01L 23/48; H01L 23/52; H01L 29/40

[52] U.S. Cl. .......................... 257/752; 257/750; 257/751; 257/758; 257/774

[58] Field of Search .................... 257/750, 751, 257/752, 758, 774; 438/627, 629, 653

[56] References Cited

U.S. PATENT DOCUMENTS

| | | | |
|---|---|---|---|
| 5,061,646 | 10/1991 | Sivan et al. | 438/626 |
| 5,243,220 | 9/1993 | Shibata et al. | 257/748 |
| 5,371,410 | 12/1994 | Chen et al. | 257/750 |
| 5,545,590 | 8/1996 | Licata | 438/626 |
| 5,652,182 | 7/1997 | Cleeves | 438/626 |
| 5,656,543 | 8/1997 | Chung | 438/625 |
| 5,872,053 | 2/1999 | Smith | 438/626 |

FOREIGN PATENT DOCUMENTS

| | | |
|---|---|---|
| 7-335757 | 12/1995 | Japan . |
| 8-236476 | 9/1996 | Japan . |

*Primary Examiner*—Mahshid Saadat
*Assistant Examiner*—Jhihan B. Clark
*Attorney, Agent, or Firm*—McDermott, Will & Emery

[57] ABSTRACT

A semiconductor device is formed with interconnections having reduced electric resistance. The semiconductor device comprises an upper wiring formed on an insulating film with a barrier metal therebetween, a conductive plug formed in a plugging space of the insulating film and electrically connected to the upper wiring at an opening of the plugging space, and a sidewall formed on a side surface of the upper wiring, the bottom of the sidewall covering the opening of the plugging space not covered by the upper wiring.

8 Claims, 15 Drawing Sheets

SEMICONDUCTOR DEVICE AND METHOD OF MANUFACTURING SEMICONDUCTOR DEVICE

TECHNICAL FIELD

1. Field of the Invention

The present invention relates to a semiconductor device and a method of manufacturing the semiconductor device and, more particularly, to a semiconductor device, such as memory, ASIC, etc., with electrical connection between conductive elements, and to a manufacturing process thereof.

2. Description of the Related Art

Described hereinafter is a conventional semiconductor device wherein an upper wiring, which is an electrode formed on an insulating film, is electrically connected to a lower wiring, which is another electrode formed under the insulating film or to a semiconductor substrate, and a manufacturing process thereof.

When forming a via hole through the insulating film on which upper wiring is mounted and forming a conductive plug by filling the via hole with a conductive material, the upper wiring may be electrically connected through the conductive plug to the lower wiring or to the semiconductor substrate. Such a connection structure is called conductive plug structure.

It is sometimes the case that a via hole for electrically connecting terminals of a transistor, etc. formed on the semiconductor substrate to the upper wiring is called "contact hole", while a via hole for electrically connecting the upper wiring and lower wiring is called "through hole", when distinction therebetween is required. In this specification, they are each and collectively reference to as a "via hole".

FIGS. 14(a) to (d) are flow diagrams showing sequential formation steps of a conventional conductive plug structure. Referring to FIGS. 14(a) to (d), a first insulating film 21 of $SiO_2$ is formed by CVD (Chemical Vapor Deposition) on a silicon substrate 1, and a via hole 3 is formed through the first insulating film 21. Via hole 3 is to be filled with a conductive material and has an opening 30 on the first insulating film 21.

Via hole 3 is formed by removing, through development, a portion corresponding to via hole 3 of a photoresist (not illustrated) applied to the first insulating film 21, and anisotropically etched RIE (Reactive Ion Etching), plasma etched or wet etched. FIG. 14(a) shows the etched state, wherein the underlying silicon substrate 1 is exposed by via hole 3 passing through the first insulating film 21.

A high melting point metal, such as titanium nitride (TiN), etc. is deposited on the entire surface of the semiconductor device by sputtering, CVD, etc., and then a conductive material, such as aluminum (Al), is deposited thereon. FIG. 14(b) shows a such state in which a high melting point barrier metal 4 is formed on first insulating substrate 21, and a conductive film 5 of Al is formed on barrier metal 4. The barrier metal 4 is also formed on the inner wall of the via hole 3 and on the exposed surface of the silicon substrate 1, and via hole 3 is filled with a conductive plug 52 formed of Al.

An anti-reflection film 6 is formed on conductive film 5 by vapor deposition of a high melting point metal, such as TiN, and a photoresist 7 is applied onto the anti-reflection film 6. The photoresist 7 is subject to patterning by photolithographical processing and removed through development leaving a required region on which upper wiring is to be formed, as shown in FIG. 14(c).

When etching the TiN and Al, the anti-reflection film 6, conductive film 5 and barrier metal 4 may be removed from the portion not coated with the photoresist 7, as shown in FIG. 14(d). In FIG. 14(d), reference numeral 51 designates an upper wiring serving as the first conductive member formed on the first insulating film 21 by etching a part of the conductive film 5, the upper wiring 51 covering the entire opening 30 of the via hole 3. As a result, through the barrier metal 4 and the conductive plug 52 serving as a second conductive material, the silicon substrate 1 and the upper wiring 51 are electrically connected to each other.

During patterning the photoresist 7, a mask (not illustrated) for photolithographic processing is sometimes inaccurately positioned, thereby causing a misalignment with respect to the silicon substrate 1 during exposure. As a result, the patterned photoresist 7 may not fully cover the opening 30 of the via hole 3, as illustrated in FIG. 15(a).

The pattern of the photoresist 7 shown in FIG. 15(a) is misaligned by a distance Lg rightward with respect to the silicon substrate 1, as compared with the pattern shown in FIG. 14(c). When etching to completely remove the barrier metal 4 on the first insulating film 21, a part of the conductive plug 52 is also etched. That is, part of the Al in the via hole 3 not coated with the photoresist 7 is etched together with the barrier metal 4, as shown in FIG. 15(b), thereby increasing the electric resistances of the conductive plug 52. As a result, when applying a current to conductive plug 52, heating is disadvantageously large as compared with an unetched conductive plug, eventually resulting in disconnection.

Since the side surface of the upper wiring is exposed at the time of etching the barrier metal, the side surface of the upper wiring is disadvantageously damaged by etching, thereby increasing the electric resistance of the upper wiring.

Moreover, barrier metal is not formed on a part of the conductive plug not covered with the upper wiring. As a result, electromigration undesirable occurs by diffusing Al to the adjacent layer. Moreover, since barrier metal is not formed on the side surface of the upper wiring, electromigration of the upper wiring also takes place.

To prevent an increase in electric resistance of the conductive plug 52, a large via hole 3 can conceivably be formed and plugged with a larger amount of Al. However, it is counter productive to form a large size conductive plug in a memory circuit (DRAM, SRAM), ASIC, etc. in which high integration and multilayer wiring are key features.

SUMMARY OF THE INVENTION

An object of the invention is a reliable semiconductor device and method of manufacturing thereof, by preventing etching of a plug when etching a barrier metal on the insulating film, thereby preventing an increase in electric resistance of a second conductive element formed in the plugging space.

A semiconductor device according to the invention comprises an insulating film formed on a semiconductor substrate; a first conductive element formed on said insulating film through a barrier metal which is a metal film of high melting point; a second conductive element formed in the plugging space of the insulating film and electrically connected to the first conductive element at an opening on the insulating film; and a sidewall formed on a side surface of the first conductive element and having a bottom covering the opening of the plugging space not covered by the first conductive element.

Consequently, when etching the barrier metal, the sidewall masks the opening of the plugging space not covered by the first conductive element, thereby protecting the second conductive element from etching and preventing an increase in the electric resistance of the second conductive element.

A method of manufacturing a semiconductor device according to the present invention comprises a first step of forming a plugging space having an opening on an insulating film formed on a semiconductor substrate by etching the insulating film and forming a barrier metal on the insulating film; a second step of forming a second conductive element by plugging the plugging space with a conductive material and forming a conductive film by mounting a conductive material on the first insulating film and on the plugging space; a third step of forming a first conductive element composed of the conductive film by etching part of the conductive film until the barrier metal is exposed; a fourth step of forming a sidewall on a side surface of the first conductive element covering the opening of the plugging space not covered by the first conductive element; and a fifth step of etching the exposed barrier metal.

Consequently, when etching the barrier metal, the second conductive element is not etched, thereby avoiding an increase in the electric resistance of the second conductive element.

Other objects and features of this invention will become understood from the following description with reference to the accompanying drawings.

DESCRIPTION OF THE INVENTION

Embodiment 1

Figure 14:
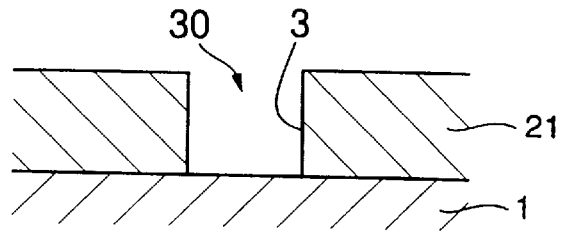
FIGS. 14(a), (b), (c) and (d) are schematic views of sequential manufacturing steps according to the prior art.
Figure 14:
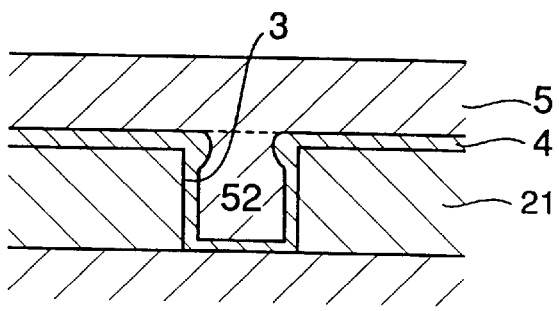
Figure 14:
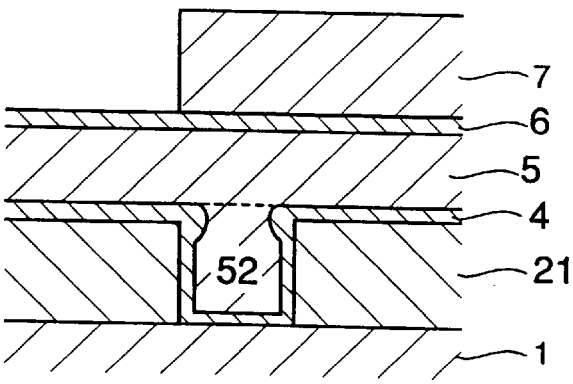
Figure 14:
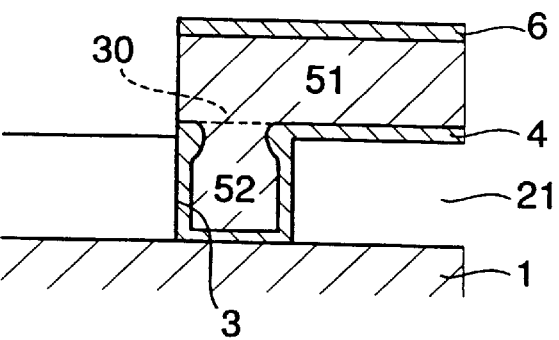
Figure 15A:
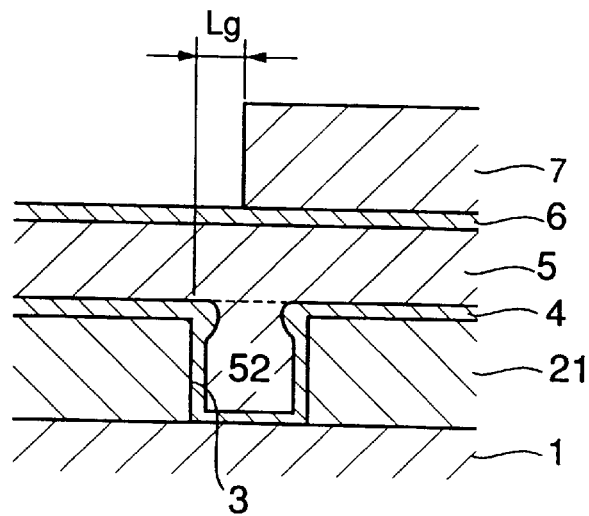
FIGS. 15(a) and (b) are sequential schematic views illustrating mask misalignment and conductive plug etching.
Figure 15B:
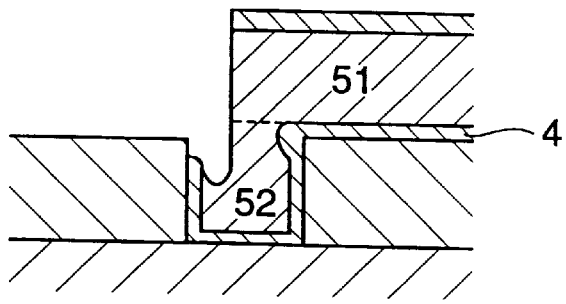

FIGS. 1(a) to (c) and FIGS. 2(a) and (b) are schematic views of sequential manufacturing steps according to embodiment 1 in order. In the illustrated semiconductor device, a patterned photoresist 7 is misaligned with respect to a silicon substrate 1. As in the conventional semiconductor device shown in FIG. 14, a conductive plug 52 serving as a second conductive element is formed by filling a via hole 3 in an first insulating film 21 with Al, whereby an upper wiring 51 serving as a first conductive element formed on the first insulating film 21 is electrically connected to the silicon substrate 1.

The first insulating film 21, e.g., $SiO_2$, is formed on and insulates the semiconductor substrate from the upper wiring 51 formed on the first insulating film 21. The via hole 3 is a plugging space for Al and is formed by etching a part of first insulating film 21, as by anisotropic RIE, and has an opening 30 on the upper face of the first insulating film 21. The via hole 3 extends through insulating film 21 up to and exposing silicon substrate 1 through the opening 30. The exposed part is used, for example, as a terminal of the transistor formed on the silicon substrate 1.

A barrier metal 4 is formed on the entire surface of the semiconductor device by depositing a high melting point metal, such as TiN, onto the upper surface of the first insulating substrate 21, inner wall surface of the via hole 3 and the exposed surface of the silicon substrate 1, as by sputtering or CVD. The barrier metal 4 is formed for the purpose of preventing deterioration of the later described conductive material forming the upper wiring 51 and conductive plug 52 by mutual diffusion and/or chemical reaction with the silicon substrate 1 and/or first insulating film 21.

Then, Al serving as the conductive material, is deposited on the entire surface of the semiconductor device, as by sputtering or CVD. At this time, the Al filling the via hole 3 forms the conductive plug 52 serving as the second conductive element, and the Al deposited on the conductive plug 52 and on the first insulating film 21 forms conductive film 5. Thereafter, an anti-reflection film 6, such as the same high melting point metal, e.g., TiN is formed on the conductive film 5.

Figure 1A:
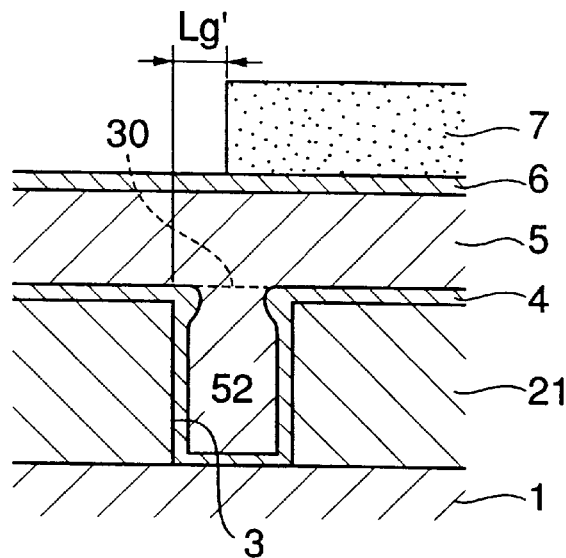
FIG. 1(a)–FIG. 2(b) are schematic views of sequential manufacturing steps according to embodiment 1 of the present invention.

A photoresist 7 is applied on the anti-reflection film 6 and patterned by photolithography. By patterning, the photoresist 7 is left only in a desired region where the upper wiring 51 is formed, while the photoresist 7 in other regions is removed by development, as shown in FIG. 1(a).

To restrict the electric resistance of the conductive plug 52, the upper wiring 51 and Al in the via hole 3 are electrically connected to each other by a sufficient contact area. For that purpose, the photoresist 7 defining the upper wiring 51 should completely covers the opening of the via hole 3. As shown in FIG. 1(a), however, photoresist 7 is misaligned and does not completely cover opening 30 of the via hole 3. Consequently, part of the photoresist 7 is removed by development and the anti-reflection film 6 is exposed above the opening 30 of the via hole 3.

Figure 1B:
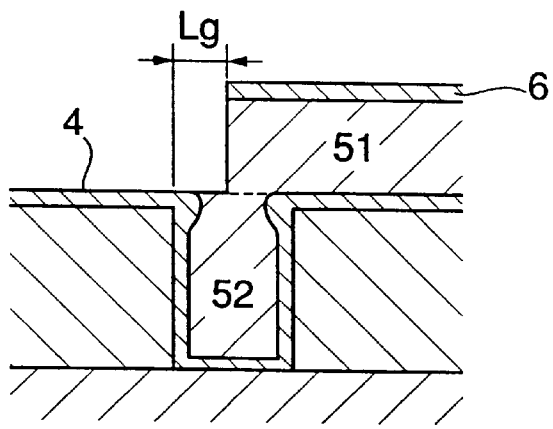

Then, the anti-reflection film 6 and conductive film 5 are subject to anisotropic RIE, plasma etching or wet etching. During etching, exposure of the barrier metal 4 is detected, and the etching step is stopped at the moment when etching has advanced to immediately above the barrier metal 4, as shown in FIG. 1(b).

Detection of the etching end point immediately above the barrier metal 4 can be based upon a change in the intensity or wave length of light emitted during etching due to chemical or physical reaction. Accordingly, by monitoring such a change, any change in the etched object, i.e., reacting material, can be detected.

Figure 3:
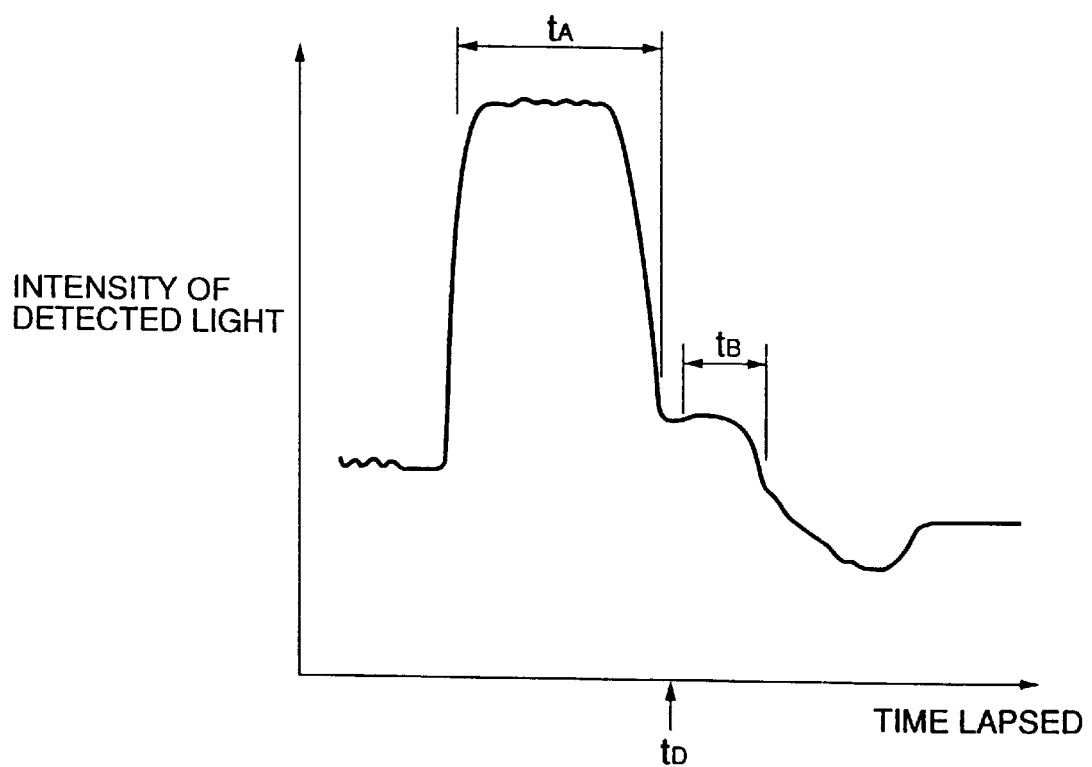
FIG. 3 is a diagram showing change in intensity of light detected when an Al film and a high melting point metal film are continuously etched.

FIG. 3 is a diagram showing a change in intensity of light detected when the conductive film 5 and barrier metal 4 are continuously etched, and in which the abscissa indicates time lapsed from starting the etching, and the ordinate indicates intensity of detected light. During etching of the conductive film 5 of Al, a light of maximum intensity is detected, while a light of lower intensity is detected when etching the barrier metal 4 of a high melting point metal. Upon completing etching of the barrier metal 4, the intensity of light is further reduced.

Accordingly, by detecting the intensity of light emitted at the time of etching and based on the change in intensity, the etching end point immediately above the barrier metal 4 can be accurately detected. More specifically, adverting to FIG. 3, tA is a time of etching Al and tB is a time of etching the barrier metal. Thus, by stopping etching at the time tD when change in intensity of light has been detected, etching is stopped immediately above the barrier metal 4 or immediately after starting etching of the barrier metal 4. Likewise, the etching can be stopped depending on a change in wave length of light. It is also possible to stop etching based upon both a change in wave length and a change in intensity of light.

Figure 1C:
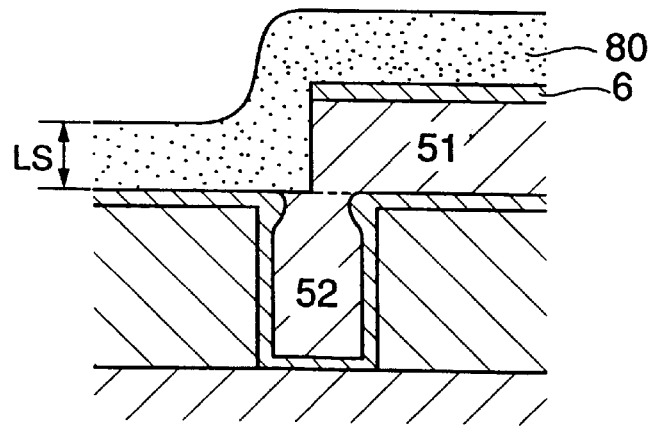
Figure 2A:
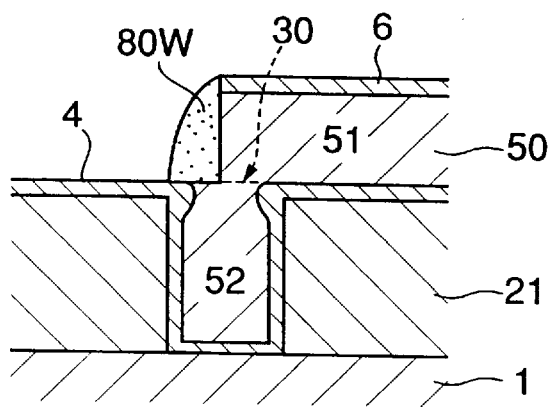

After etching, an insulating film 80, such as $SiO_2$, is formed on the entire surface of the semiconductor device 1. Insulating film 80 is then etched to form a sidewall 80W on the side surface of the upper wiring 51, as by anisotropic RIE, plasma etching or wet etching. Sidewall 80W is formed such that the opening 30 of the via hole 3 not covered by the upper wiring 51 is completely masked, as shown in FIGS. 1(c) and 2(a).

Figure 2B:
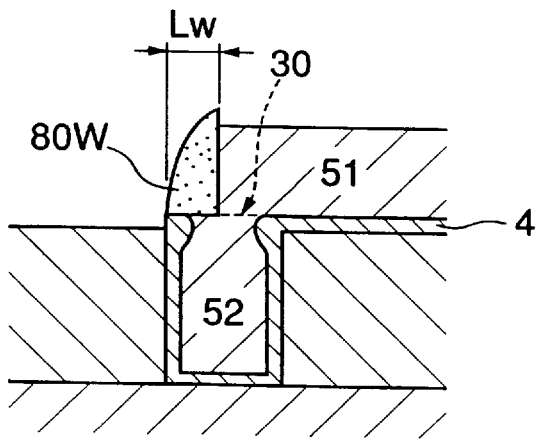

Subsequently, another etching step is performed to remove the barrier metal 4 and anti-reflection film 6; however, during such etching, Al in the via hole 3, i.e., conductive plug 52, is protected from being etched due to masking by the sidewall 80W, as shown in FIG. 2(b).

A width Lw of the bottom part of the sidewall 80W is controlled by adjusting the film thickness Ls of the insulating film 80. In other words, the film thickness Ls is controlled to correspond to the distance from the end of the opening 30 of the via hole 3 not covered by the upper wiring 51 to the end of the upper wiring 51, thereby providing sidewall 80W with a sufficient width Lw to mask the exposed plug 52.

More specifically, Lg indicating the degree of misalignment of the upper wiring 51 in FIG. 1(b) or Lg' indicating the degree of misalignment of the photoresist 7 in FIG. 1(a), is preliminarily measured and, based on the measured value, a film thickness Ls of the insulating film 80 is controlled, whereby the sidewall 80W is formed such that at least the opening 30 of the via hole 3 not covered by the upper wiring 51 is covered by the sidewall 80W, thereby optimizing the width of the sidewall 80W. In particular, by controlling the width Lw of the bottom part of the sidewall 80W to equal the degree of misalignment Lg, the area of the conductive plug 52 including the sidewall 80W can be desirably minimized.

Figure 4:
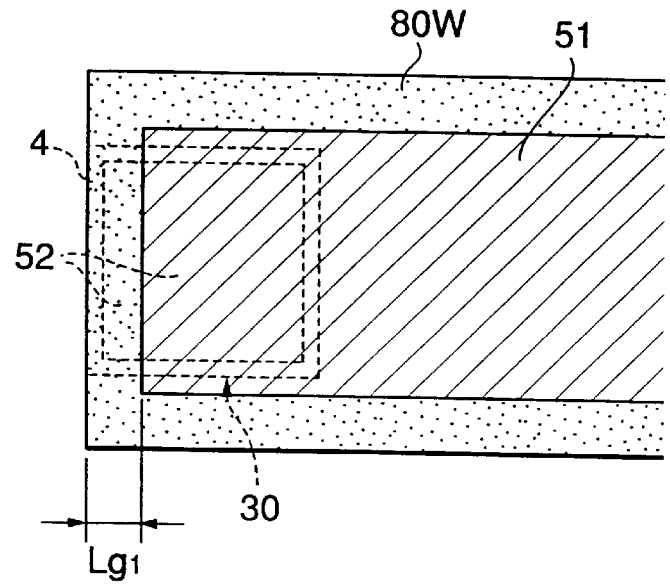
FIGS. 4(a) and (b) are top schematic views of a semiconductor device according to embodiment 1 of the invention.
Figure 4:
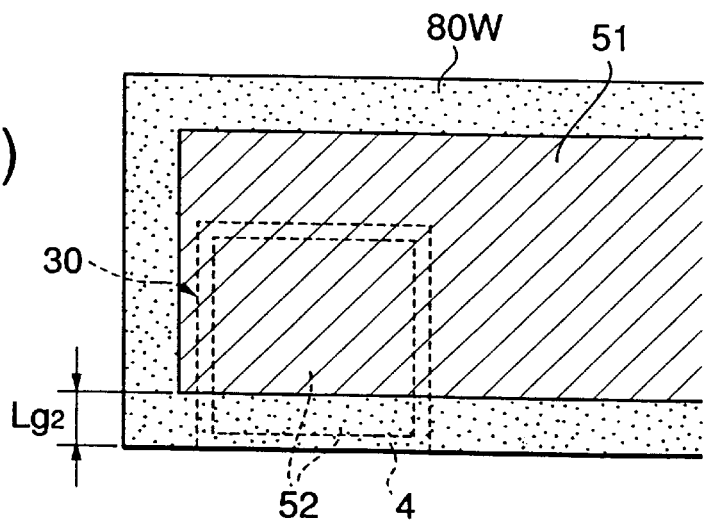

FIGS. 4(a) and (b) respectively show a semiconductor device manufactured in this manner as seen from above. FIG. 4(a) illustrates misalignment of the upper wiring 51 by a distance Lg1 with respect to the via hole 3 in the wiring direction, which corresponds to the misalignment direction shown in FIGS. 1 and 2. On the other hand, FIG. 4(b) illustrates misalignment of the upper wiring 51 by a distance Lg2 with respect to the via hole 3 in a direction perpendicular to the wiring direction, i.e., a misalignment of the upper wiring 51 vertically to the surface of FIGS. 1 and 2. In either case, the opening 30 of the via hole 3 is completely masked by the upper wiring 51 and sidewall 80W.

In the event of misalignment in two different directions, that is, both in the wiring direction and in the direction perpendicular to the wiring direction, both misalignment distances Lg1 and Lg2 are measured and, based on the larger distance, the width Lw of the bottom part of the sidewall 80W is controlled.

In the above described semiconductor device, the sidewall 80W masks the exposed conductive plug 52, thereby preventing the conductive plug 52 from being etched when etching the barrier metal 4. As a result, the electric resistance of the conductive plug 52 is restrained from increasing.

Since the sidewall 80W masks the side surface of the upper wiring 51, the side of the upper wiring 51 is prevented from being damaged or from being shifted backward at the time of etching the barrier metal 4. As a result, the electric resistance of the upper wiring itself does not increase.

In the above described manufacturing process, a change in intensity of light emitted from the object to be etched or change in wave length is detected, and etching is stopped accordingly. Consequently, the conductive plug 52 is free from being etched at the time of etching the conductive film, and the electric resistance of the conductive plug 52 is prevented from increasing.

Further, in the above described manufacturing process, with regard to the opening 30 of the plugging space not covered by the upper wiring 51, the distance from the end of opening 30 to the end of the upper wiring 51 (i.e., the uncovered distance) is measured and, based on the measured value, the width of the bottom part of the sidewall 80W is controlled. Consequently, sidewall 80W is formed to completely cover the opening 30 of the plugging space which is not covered by the upper wiring 51, thereby preventing an increase in the electric resistance of the conductive plug 52.

Embodiment 2

Figure 5A:
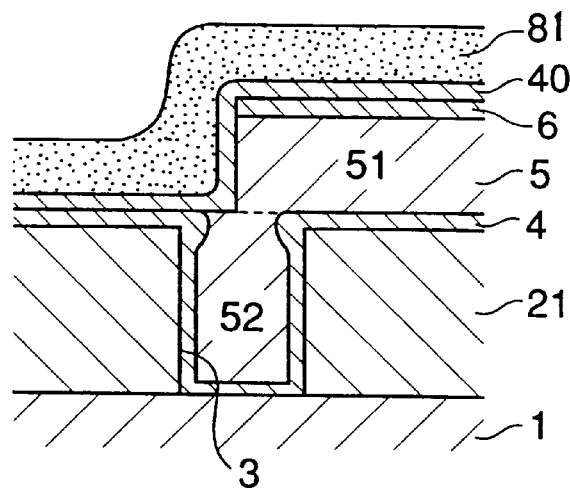
FIGS. 5(a), (b) and (c) are schematic views of sequentially manufacturing steps according to embodiment 2 of the invention.
Figure 5B:
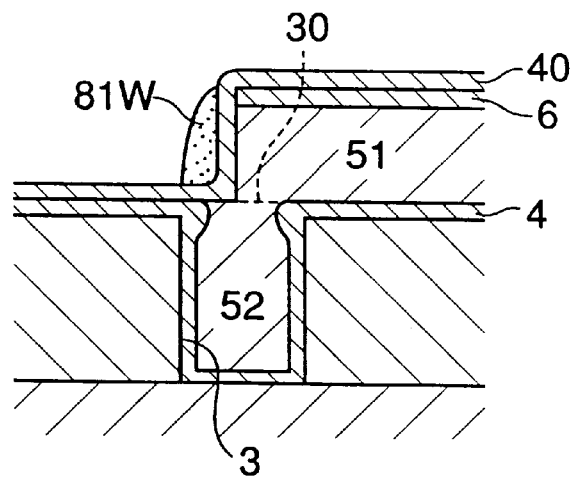
Figure 5C:
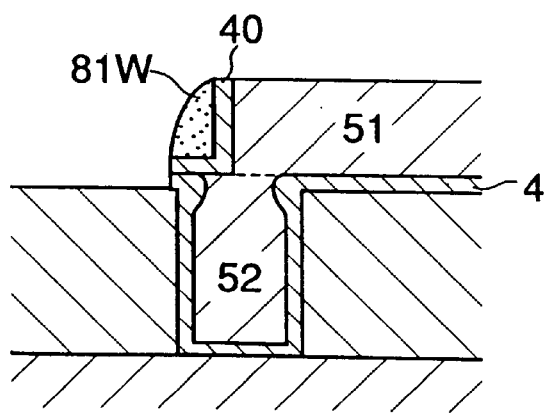

FIGS. 5(a) to (c) are schematic views of sequential manufacturing steps according to embodiment 2 of the invention. In this semiconductor device, in the same manner as the foregoing embodiment 1, after manufacturing the semiconductor device shown in FIG. 1(b), a high melting point metal is deposited on the entire surface of the semiconductor, as by sputtering or CVD. Whereby a metal film 40 of high melting point is formed on the barrier metal 4, anti-reflection film 6 and the side surface of the upper wiring 51, respectively. An insulating film 81, such as $SiO_2$, is formed on the high melting point metal film 40, as shown in FIG. 5(a).

By etching insulating film 81, a sidewall 81W is formed on the side surface of the upper wiring 51 through the metal film 40 of high melting point, as shown in FIG. 5(b). The width of the bottom of sidewall 81W is controlled by adjusting the film thickness of the insulating film 81 in the same manner as in embodiment 1. Accordingly, by measuring the distance from the end of the opening 30 of the via hole 3 not covered by the upper wiring 51 to the end of the upper wiring 51, and by controlling the film thickness based on the measured value, the sidewall 81W is formed such that the opening 30 of the via hole 3 is completely masked with the sidewall 81W.

Finally, the metal film 40 of high melting point, barrier metal 4 and anti-reflection film 6 are etched. Since the opening 30 of the via hole 3 is completely masked by the upper wiring 51 and sidewall 81W, Al in the via hole 3 is not etched, as shown in FIG. 5(c).

In the semiconductor device provided with sidewall 81W, not only is the electric resistance of the conductive plug 52 prevented from being increased, but the electric resistance of the upper wiring 51 itself, is also prevented from being increased.

Since the conductive metal film 40 of high melting point is formed on the conductive plug 52, part of the current between the upper wiring 51 and the conductive plug 52 flows through the metal film 40 of high melting point, thereby reducing the electric resistance of the conductive plug 52. Further, since the metal film 40 of high melting point is also formed on the side surface of the upper wiring 51, the electric resistance of the upper wiring 51 itself is also reduced.

Furthermore, since the sidewall 81W is formed on the metal film 40 of high melting point, the metal film 40 of high melting point may serve as a barrier metal. That is, Al is prevented from diffusing from the upper surface of the conductive plug 52 and from the side of the upper wiring 51. In other words, the metal film 40 of high melting point functions as a barrier metal, thereby reducing electromigration in the upper wiring 51 and the conductive plug 52.

Embodiment 3

Figure 6A:
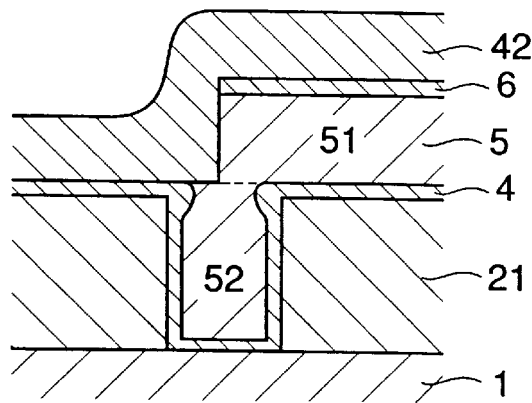
FIGS. 6(a), (b) and (c) are schematic views of sequential manufacturing steps according to embodiment 3 of the invention.

FIGS. 6(a), (b) and (c) are schematic views of sequential manufacturing steps according to embodiment 3 of the invention. In this semiconductor device, in the same manner as the foregoing embodiment 1, after manufacturing the semiconductor device shown in FIG. 1 (b), a metal of high melting point is deposited on the entire surface of the semiconductor, as by sputtering or CVD whereby a metal film 42 of high melting point is formed.

The metal film 42 of high melting point is formed by employing either a metal having about the same resistance to etching as the metal of high melting point forming the barrier metal 4 or a metal having a higher resistance to etching. That is, the metal film 42 of high melting point may be made not only of the same metal as the barrier metal 4 but also of any other different metal, as long as the metal has about the same or higher resistance to etching with respect to the etchant, i.e., etching medium such as etching liquid or etching gas, employed when etching the barrier metal 4.

Then, the metal film 42 of high melting point is etched together with the barrier metal 4 and anti-reflection film 6, thereby forming sidewall 42W of the high melting point metal. Etching is performed by anisotropic RIE, plasma etching or wet etching.

Figure 6B:
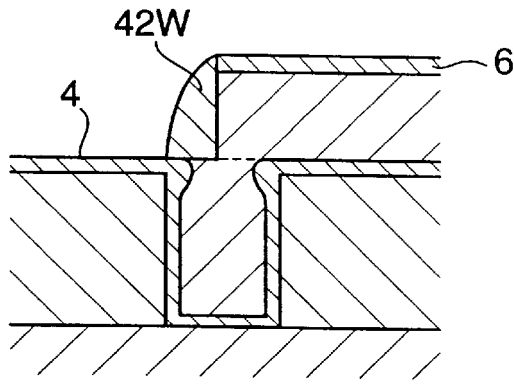
Figure 6C:
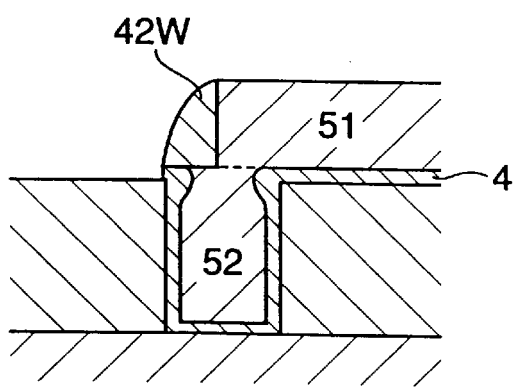

Metal film 42 of high melting point has about the same or higher resistance to etching as that of the barrier metal 4. Therefore the opening 30 of the via hole 3 not covered with the upper wiring 51 is masked by the sidewall 42W, and Al the via hole 3 is not etched, as shown in FIGS. 6(b) and (c).

Since the sidewall 42W is made of a metal of high melting point, the sidewall 42W is conductive, and as compared with the foregoing embodiment 2, the conductive region between the upper wiring 51 and conductive plug 52 is increased. Accordingly, the electric resistance may be more effectively reduced in and around the conductive plug 52. Further, since the side surface of the upper wiring 51 is masked during etching of the barrier metal 4, the electric resistance of the upper wiring 51 itself is not increased.

Since the barrier metal 4 can be etched at the same time the metal film 42 of high melting point is etched to form sidewall 42W or in succession to etching metal film 42, the number of steps is reduced as compared with the foregoing embodiment 2.

Embodiment 4

FIGS. 7(a) to (c) and FIGS. 8(a) to (c) are schematic views of sequential manufacturing steps according to embodiment 4 of the invention. In the illustrated semiconductor device, the patterned photoresist 7 is misaligned with respect to the silicon substrate 1.

Figure 7A:
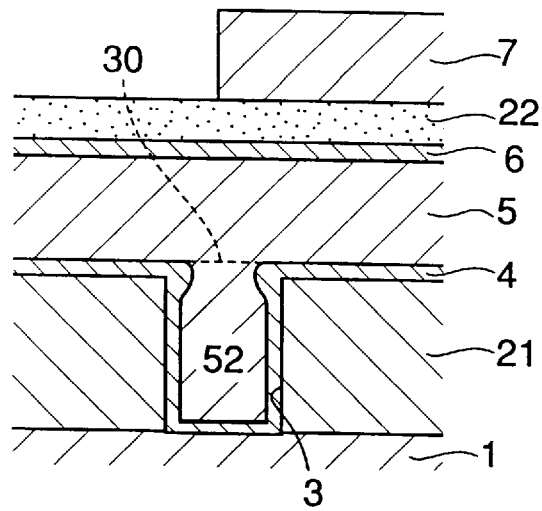
FIG. 7(a)–FIG. 8(c) are schematic views of sequential manufacturing steps according to embodiment 4 of the invention.

In the semiconductor device shown in FIG. 7(a), in the same manner as the foregoing embodiment 1, the conductive plug 52 is formed in the via hole 3 of the first insulating film 21, and the conductive film 5 and the anti-reflection film 6 are also formed. In the semiconductor device, a second insulating film 22, such as $SiO_2$, is further formed before application of the photoresist 7 and patterning.

Figure 7B:
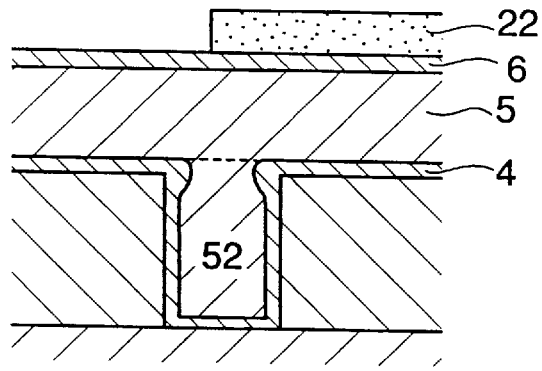

The photoresist 7 is subject to patterning by conventional photolithographic techniques leaving photoresist 7 only in a desired region where the upper wiring 51 is formed, while the photoresist 7 in other regions is removed by development. At this time, the mask is misaligned and a part above the opening 30 of the via hole 3 is not fully masked with the photoresist 7. After removing the second insulating film 22 not masked with the photoresist 7 by etching, the photoresist 7 is removed, as shown in FIG. 7(b).

Figure 7C:
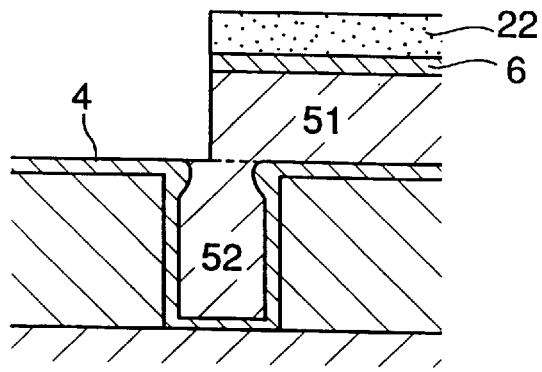
Figure 8A:
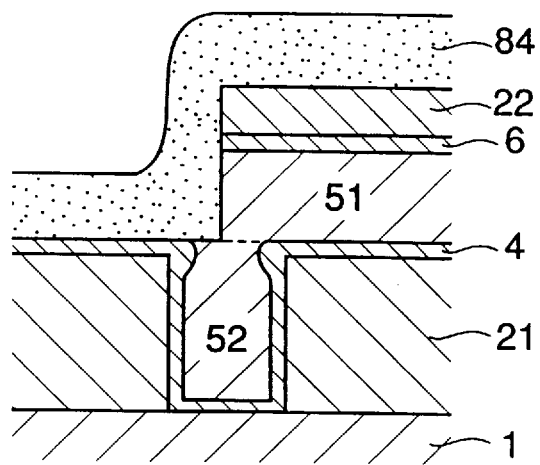
Figure 8B:
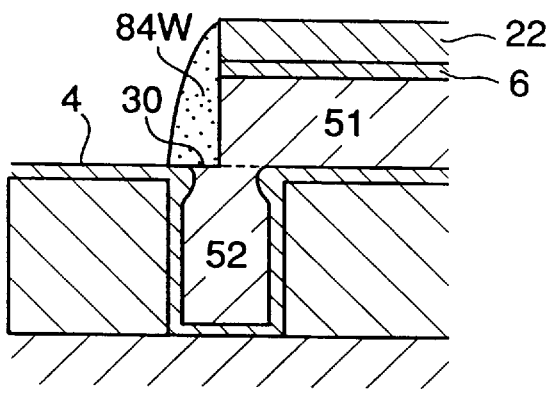
Figure 8C:
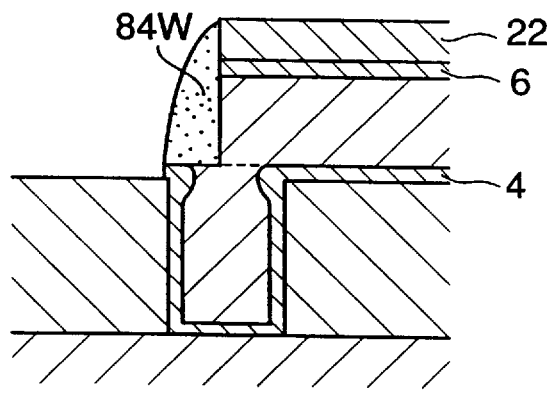

Since the patterned second insulating film 22 serves as an etching mask for the conductive film 5 and anti-reflection film 6, etching of the conductive film 5 is then initiated to etch the conductive film 5 together with the anti-reflection film 6, and stopped directly above the barrier metal 4, as shown in FIG. 7(c).

After forming an insulating film 84, such as $SiO_2$, on the entire surface of the semiconductor device 1, etching is performed to form a sidewall 84W of the insulating film on the side surface of the upper wiring 51. The width of the bottom part of sidewall 84W is controlled based on the measured misalignment distance, and the sidewall 84W masks the opening 30 of the via hole 3 not covered by the upper wiring 51, as shown in FIGS. 8(d) and (e).

When etching the barrier metal 4 to remove unnecessary barrier metal 4 left on the insulating film 21, Al in the via hole 3 is prevented from being etched due to masking by the sidewall 84W. Since the anti-reflection film 6 formed on the upper wiring 51 is masked by the second insulating film 22 and not exposed when removing unnecessary barrier metal 4, the anti-reflection film 6 may remain on the upper wiring 51, as shown in FIG. 8(f).

In the semiconductor device thus manufactured, the sidewall is advantageously formed the same manner as the foregoing embodiment 1. In addition, the anti-reflection film 6 is not etched when etching the barrier metal 4, as a result of forming the second insulating film 22 on the anti-reflection film 6. Consequently, the anti-reflection film 6 may be left on the upper wiring 51, thereby improving precision in subsequent patterning.

For example, when a wiring is further formed on the insulating film 22, and the wiring electrically connected with the upper wiring 51 through a conductive plug formed in the second insulating film 22, precision in photolithographic processing is improved thereby increasing the accuracy of the via hole configuration and dimensions.

In addition, as the result of forming the anti-reflection film 6 of a high melting point metal on the upper wiring 51, Al diffusion is effectively prevented from the upper surface of the upper wiring 51. That is, the anti-reflection metal 6 serves as a barrier metal, thereby reducing or preventing electromigration in the upper wiring 51.

Embodiment 5

Figure 9A:
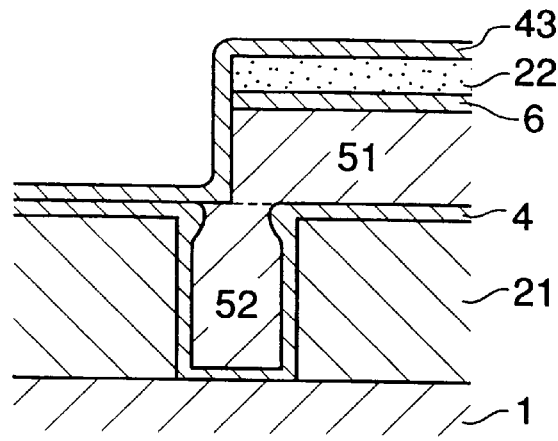
FIGS. 9(a), (b) and (c) are schematic views of sequential manufacturing steps according to embodiment 5 of the invention.
Figure 9B:
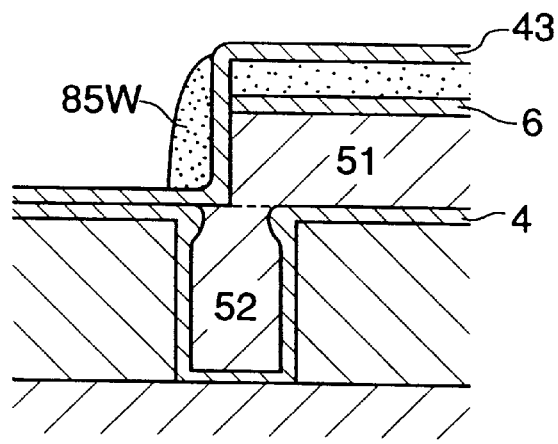
Figure 9C:
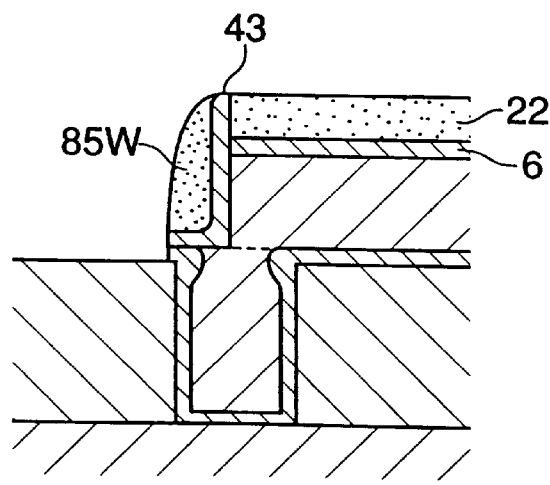

FIGS. 9(a) to (c) are schematic views of sequential manufacturing steps of a semiconductor device according to embodiment 5 of the invention. In the semiconductor device shown in FIG. 9(a), in the same manner as the foregoing embodiment 4, after manufacturing the semiconductor device shown in FIG. 7(c), a metal of high melting point is deposited on the entire surface of the semiconductor, as by sputtering or CVD, whereby a metal film 43 of high melting point is formed.

An insulating film (not illustrated) is formed on metal film 43 of high melting point, and then etched to form a sidewall 85W on the side surface of the upper wiring 51 through the metal film 43 of high melting point. At this time, the bottom face of the sidewall 85 is located above the opening 30 of the via hole 3, and is formed on the metal film 43 of high melting point. The width of the bottom part of the sidewall 85W is controlled by the measured degree of misalignment such that the sidewall 85W masks the conductive plug 52 not covered with the upper wiring 51, as shown in FIG. 9(b)

When etching the metal film 43 and barrier metal 4 to remove unnecessary barrier metal 4 left on the insulating film 21, the sidewall 85W and the metal film 43 right under the sidewall 85W serve as an etching mask, whereby Al in the via hole 3 is prevented from being etched, as shown in FIG. 9(c).

In the semiconductor device manufactured in this manner, since the metal film 43 of high melting point is formed on the conductive plug 52 and on the side surface of the upper wiring 51, the conduction area is increased, thereby reducing the electric resistance of the conductive plug 52 and the upper wiring 51. Further, this metal film 43 of high melting point prevents diffusion of Al. That is, the metal film 43 of high melting point functions as a barrier metal, thereby restraining electromigration of the upper wiring 51 and the conductive plug 52.

Embodiment 6

Figure 10A:
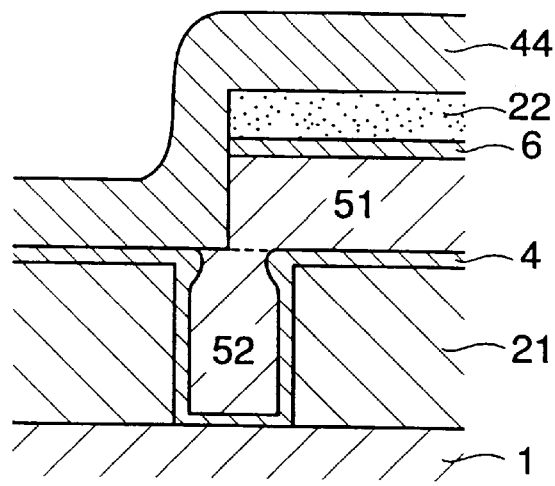
FIGS. 10(a), (b) and (c) are schematic views of sequential manufacturing steps according to embodiment 6 of the invention.
Figure 10B:
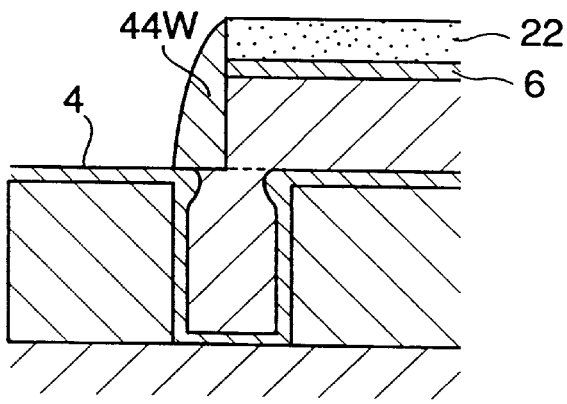
Figure 10C:
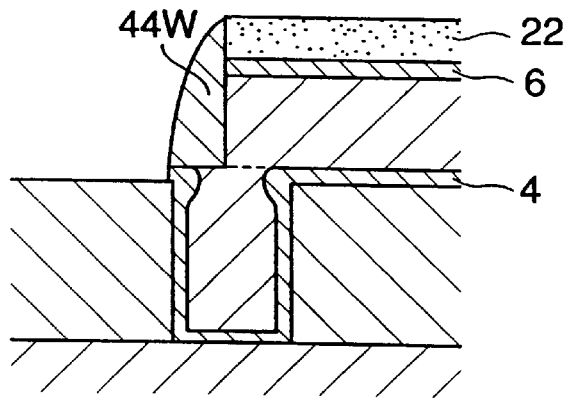

FIGS. 10(a) to (c) are schematic views of sequential manufacturing steps according to embodiment 6 of the invention. In the semiconductor device shown in FIG. 10(a), in the same manner as the foregoing embodiment 4, after manufacturing the semiconductor device shown in FIG. 7(c), a metal of high melting point is deposited on the entire surface of the semiconductor, as by sputtering or CVD whereby a metal film 44 of high melting point is formed. In the same manner as the metal film 42 of high melting point in the foregoing embodiment 3, the metal film 44 of high melting point is formed by employing either a metal having almost the same resistance to etching as the metal of high melting point forming the barrier metal 4 or a metal having a higher resistance to etching, as shown in FIG. 10(a).

By etching this film of high melting point, a sidewall 44W is formed on the side surface of the upper wiring 51. The width of the bottom part of the sidewall 44W is controlled by measuring the degree of misalignment such that the sidewall 44W masks the opening 30 of the via hole 3 not covered by the upper wiring 51, as shown in FIG. 10(b).

By etching the barrier metal 4, unnecessary barrier metal 4 left on the insulating film 21 is removed, as shown in FIG. 10(c). At this time, as the sidewall 44W serves as an etching mask, Al in the via hole 3 is prevented from being etched during etching of the barrier metal 4.

Barrier metal 4 can be etched at the same time as etching metal film 44 of high melting point forming the sidewall 44W or in succession to etching metal film 44, thereby reducing the number of steps as compared with the foregoing embodiment 5.

Since the sidewall 44W is composed of a metal of high melting point and is conductive, the conductive area is further increased as compared with embodiment 5, thereby reducing the electric resistance of the conductive plug 52. Further, the electric resistance of the upper wiring 51 itself is effectively reduced.

Embodiment 7

The conductive plug structure for connecting the silicon substrate 1 and the upper wiring 51 as described in the foregoing embodiments 1 to 6 and described hereinafter is a conductive plug structure formed in an interlayer insulating film of a semiconductor device having a multilayer wiring structure.

Figure 11:
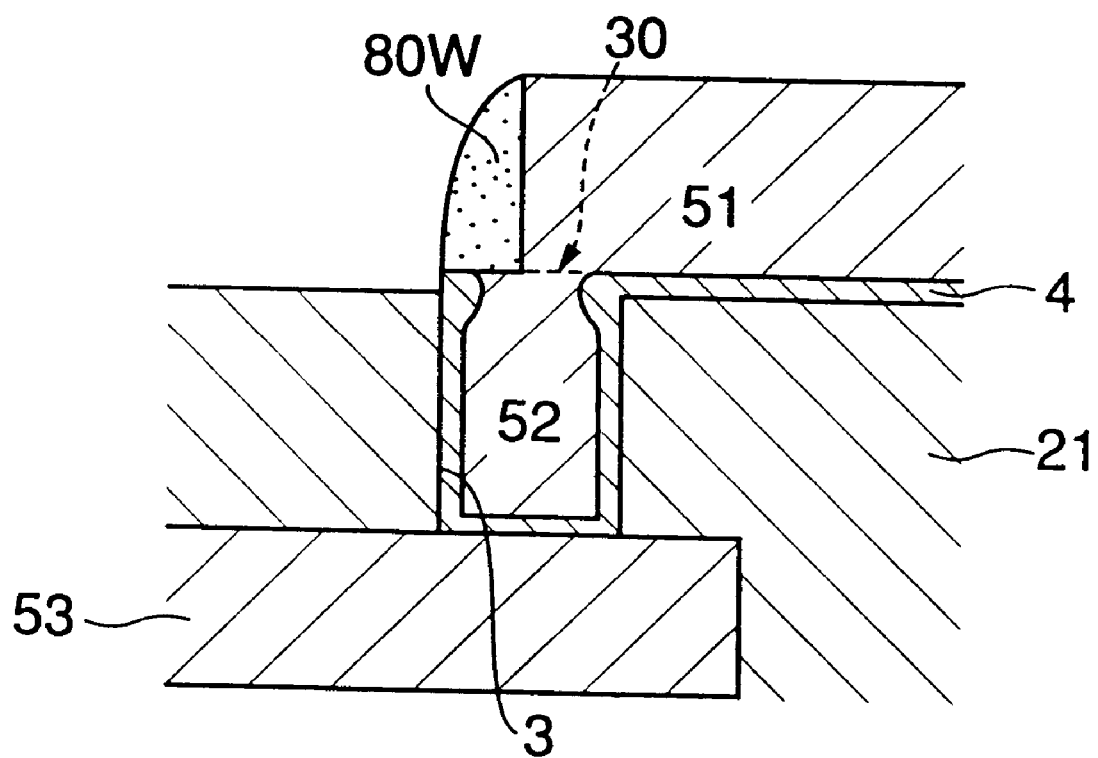
FIG. 11 is a schematic view of part of a semiconductor device according to embodiment 7 of the invention.

FIG. 11 is a schematic view showing an arrangement of part of a semiconductor device according to embodiment 7 of the invention. In the illustrated semiconductor device, a patterned upper wiring 51 is misaligned with respect to a silicon substrate (not illustrated).

In FIG. 11, reference numeral 53 designates a lower wiring which is formed directly or through any other layer on the silicon substrate (not illustrated) to serve as a third conductive element, such as Al or polysilicon, and to which patterning is applied when required. The first insulating film 21 is formed on the lower wiring 53, and the upper wiring 51 is formed further thereon through the barrier metal 4. That is, the first insulating film 21 is an interlayer insulating film, and the conductive plug formed in this interlayer insulating film 21 is electrically connected to the upper wiring 51 and to the lower wiring 53.

A sidewall 80W of an insulating film is formed on the side surface of the upper wiring 51 in the same manner as the foregoing embodiment 1. The sidewall 80W can be formed by the same manufacturing steps shown in FIGS. 1 and 2, even when forming the interlayer insulating film 21 on the lower wiring 53. During etching of the barrier metal 4, the sidewall 80W masks the opening 30 of the via hole 3 not covered by the upper wiring 51, thereby preventing conductive plug 52 from being etched.

Figure 12A:
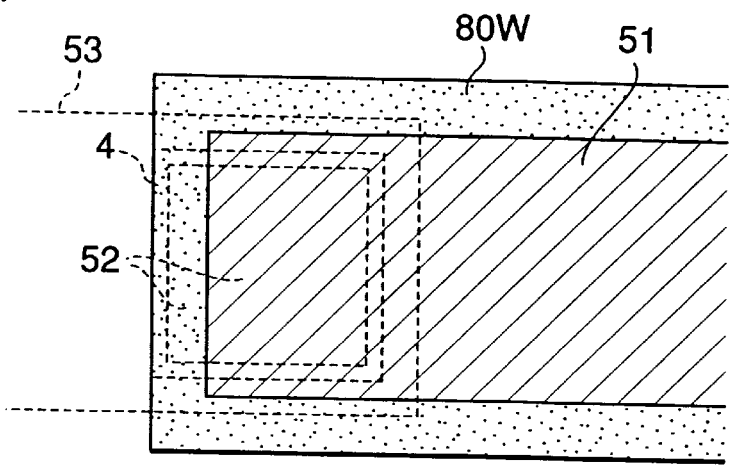
FIGS. 12(a) and (b) are top schematic views of a semiconductor device according to embodiment 7 of the invention.

FIGS. 12(a) and (b) are top schematic views of the semiconductor device manufactured according to embodiment 7. In the semiconductor device shown in FIG. 12(a), the upper wiring 51 and the lower wiring 53 are in parallel, and the two wirings are electrically connected to each other at one end by conductive plug 52. In this embodiment, the upper wiring 51 is misaligned in the wiring direction with respect to the via hole 3, which corresponds to the semiconductor device shown in FIG. 11.

Figure 12B:
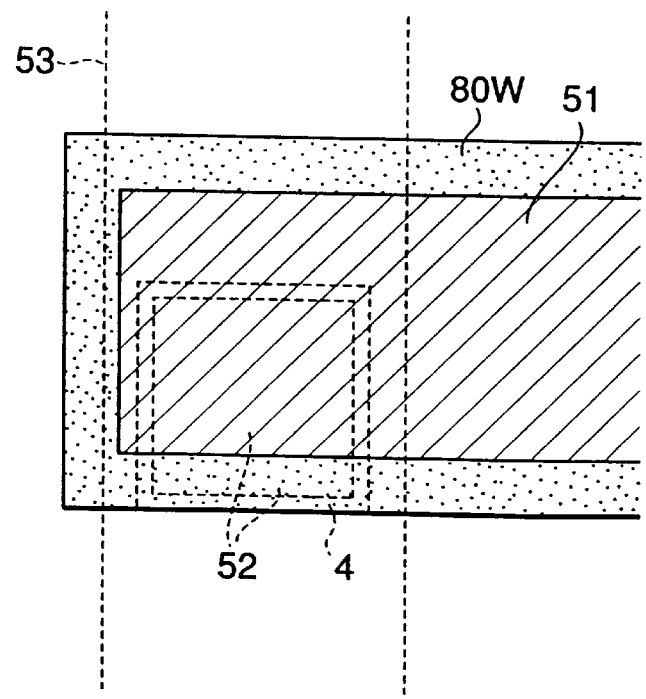

In the semiconductor device shown in FIG. 12(b), the upper wiring 51 and the lower wiring 53 are orthogonal to each other, and one end of the upper wiring 51 is electrically connected to a portion other than an end of the lower wiring 53 through the conductive plug 52. In FIG. 12(b), the upper wiring 51 is misaligned with respect to the via hole 3 in a direction perpendicular to the wiring direction.

Figure 13:
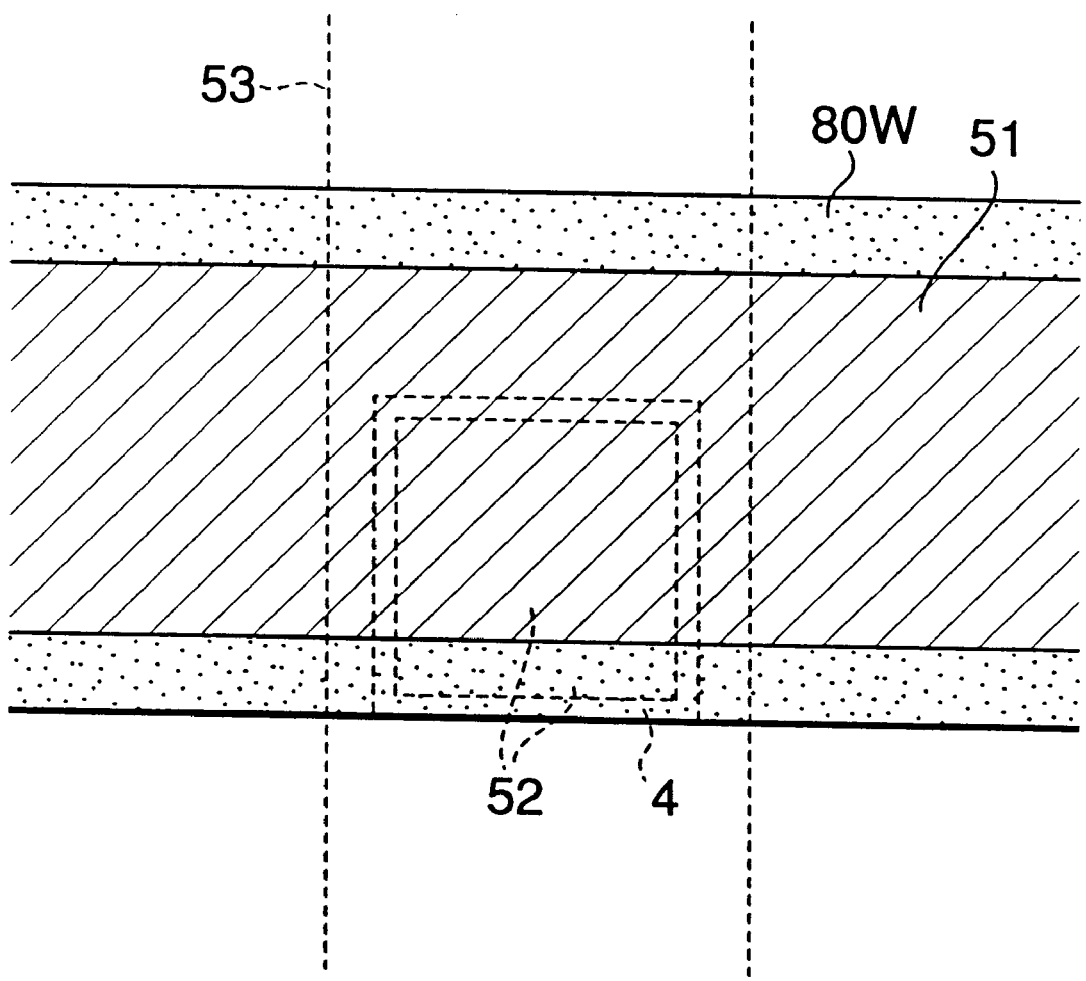
FIG. 13 is a schematic view of another semiconductor device according to embodiment 7 of the invention.

FIG. 13 is a top schematic view of a further example of the semiconductor device according to embodiment 7 of the invention. In FIG. 13, the upper wiring 51 and the lower wiring 53 are orthogonal to each other crossing at a non terminal portion, and the two wirings are electrically connected to each other through the conductive plug 52 formed at the crossing point. In FIG. 13, the upper wiring 51 is misaligned with respect to the via hole 3 in a direction perpendicular to the wiring direction, and therefore a sidewall 80W is formed.

The foregoing embodiments 2 to 6 may be applied to a conductive plug formed in the interlayer insulating film of the multilayer-interconnected semiconductor device, in the same manner as this embodiment.

The present invention is not limited to a conductive plug structure, but can be applied to any structure for electrically connecting two conductive elements formed in different layers. It is not always necessary that the via hole 3 is a hole passing through the insulating film as long as the via hole 3 forms a plugging space to be filled with a conductive material.

Although Al is employed as the upper wiring and conductive material to plug the via hole 3 in the foregoing embodiments 1 to 6, other conductive materials can be employed, such as tungsten (W), copper (Cu), nickel (Ni), or compounds thereof (including Al compounds). Further, materials such as silicon (Si) polycrystalline silicon, germanium (Ge), composites such as tungsten silicide (WSi) or cobalt silicide ($CoSi_2$) with a metallic element, or compound semiconductor materials, can also be employed.

Although the plugging material in the via hole 3 is same material as the upper wiring 51 in the foregoing embodiments 1 to 6, they need not be the same material as long as they are conductive materials. In addition, it is not always necessary that they are simultaneously formed. For example, an Al compound can be initially deposited and an Al compound substantially deposited by sputtering or CVD.

In addition, when forming the conductive plug 52 employing the same material as the upper wiring 51, they may be formed simultaneously. As a result, the number of steps is reduced as compared with the formation employing a different material from the upper wiring 51.

While the presently preferred embodiments of the present invention have been shown and described, it is to be understood these disclosures are for the purpose of illustration and that various changes and modifications may be made without departing from the scope of the invention as set forth in the appended claims.

What is claimed is:

1. A semiconductor device comprising:

a first insulating film formed on a semiconductor substrate;

a first conductive element formed on the first insulating film with a high melting point barrier metal therebetween;

a second conductive element formed in a plugging space of the insulating film and electrically connected to the first conductive element at an opening on the first insulating film, a portion of which opening is covered by the first conductive element; and a sidewall formed on a side surface of the first conductive element and having a bottom surface covering a portion of the opening of the plugging space which is not covered by the first conductive element.

2. The semiconductor device as defined in claim 1, wherein the sidewall is formed on the side surface of the first conductive element with a high melting point metal film therebetween, and the bottom surface of the sidewall is formed on the second conductive element with a high melting point metal film therebetween.

3. The semiconductor device as defined in claim 1, wherein the sidewall comprises a high melting point metal having about the same resistance to etching as the barrier metal or a greater resistance to etching than the barrier metal with respect to a particular etchant.

4. The semiconductor device as defined in claim 1, further comprising an anti-reflection film comprising a high melting point metal and formed on the first conductive element, and a second insulating film formed on the anti-reflection film, wherein the sidewall is formed on side surfaces of the first conductive element, anti-reflection element, and the second insulating film.

5. The semiconductor device as defined in claim 4, wherein the sidewall is formed on side surfaces of the first conductive element, anti-reflection film, and the second insulating film with the high melting point metal film therebetween, and a part of the bottom surface of the sidewall is formed on the second conductive element with the high melting point metal film therebetween.

6. The semiconductor device as defined in claim 4, wherein the sidewall comprises a metal of high melting point having almost the same resistance to etching as the barrier metal or a larger resistance to etching than the barrier metal with respect to a particular etchant.

7. The semiconductor device as defined in claim 1, wherein the second conductive element is a conductive plug for electrically connecting a semiconductor substrate to the first conductive element.

8. The semiconductor-device as defined in claim 1, wherein the second conductive element is a conductive plug for electrically connecting a third conductive element formed on a lower layer than the first insulating film to the first conductive element.

* * * * *